(12) United States Patent
Shibatani

(10) Patent No.: US 8,068,296 B2
(45) Date of Patent: Nov. 29, 2011

(54) DRIVING DEVICE

(75) Inventor: Kazuhiro Shibatani, Sakai (JP)

(73) Assignee: Konica Minolta Opto, Inc., Tokyo (JP)

( * ) Notice: Subject to any disclaimer, the term of this patent is extended or adjusted under 35 U.S.C. 154(b) by 114 days.

(21) Appl. No.: 12/384,755

(22) Filed: Apr. 8, 2009

(65) Prior Publication Data

US 2009/0251804 A1 Oct. 8, 2009

(30) Foreign Application Priority Data

Apr. 8, 2008 (JP) ................................. 2008-100091

(51) Int. Cl.
*G02B 5/122* (2006.01)
(52) U.S. Cl. ...................................... 359/824
(58) Field of Classification Search .................. 359/694, 359/696, 824; 310/335, 28
See application file for complete search history.

(56) References Cited

U.S. PATENT DOCUMENTS 5,774,179 A * 6/1998 Chevrette et al. .......... 348/218.1
6,483,226 B1 * 11/2002 Okada .......................... 310/328

FOREIGN PATENT DOCUMENTS

JP    2003-189645 A    7/2003

* cited by examiner

*Primary Examiner* — Joseph P Martinez
(74) *Attorney, Agent, or Firm* — Brinks, Hofer, Gilson & Lione

(57) ABSTRACT

There is provided a driving device with less wiring and of which driving circuit is simplified. A driving device comprising: a plurality of vibratory actuators 6, 7 respectively having a vibration generating portion which transform an electric power into a vibration and a driven portion which engages with the vibration generating portion; and a driving circuit to which the plurality of vibratory actuators are connected in parallel, wherein the vibration generating portion of at least one of the vibratory actuators has a different frequency characteristic from that of other vibratory actuators, and the driving circuit is capable of outputting a plurality of driving voltages each having a different waveform.

9 Claims, 8 Drawing Sheets

DRIVING DEVICE

This application is based on application No. 2008-100091 filed in Japan, the contents of which are hereby incorporated by reference.

FIELD OF THE INVENTION

This invention relates to a driving device, specifically to a driving device comprising a plurality of vibratory actuators.

BACKGROUND OF THE INVENTION

For example, in a Cartesian coordinate driving device, an actuator driving in direction of X-axis and an actuator driving in direction of Y-axis should be driven. To this end, it is required to provide two sets of driving circuits and to wire to the two actuators from the respective driving circuits with conductive leads.

It is described an invention having a simplified circuit in which two driving circuits share one portion in JP 2003-189645 A. However, wiring between the driving circuits and piezoelectric elements of the actuators is still independently and respectively made. Therefore, it is desired further simplification, downsizing and cost reduction.

SUMMARY OF THE INVENTION consequently, an object of the invention is to provide a driving device with less wiring and a simplified driving circuit.

In order to achieve the above object, there is provided a driving device according to the present invention comprising: a plurality of vibratory actuators respectively having a vibration generating portion which transform an electric power into a vibration and a driven portion which engages with the vibration generating portion; and a driving circuit to which the plurality of vibratory actuators are connected in parallel, wherein the vibration generating portion of at least one of the vibratory actuator has a different frequency characteristic from that of other vibratory actuators, and the driving circuit is capable of outputting a plurality of driving voltages each having a different waveform.

With this configuration, by inputting a driving voltage having a waveform adapted to drive any one of the vibratory actuators, it is possible to drive a specific vibratory actuator broadly and to keep other vibratory actuators immobile or within a slight movement. Thus, only one driving circuit is required and only two conductive leads are required to be wired out from the driving circuit.

In the driving device according to the present invention, the driving voltages may respectively be rectangular wave and have different frequency and further have different duty ratio.

With this configuration, the actuators can be driven by a bridge circuit and the driving voltage can be easily chosen by a microcomputer control.

In the driving device according to the present invention, it is prefer that the duty ratio comes to have big deference between ON duration and OFF duration in the case of the frequency of the driving voltage is high, and the duty ratio comes to have small deference between ON duration and OFF duration in the case of the frequency of the driving voltage is low.

With this configuration, due to the difference of the duty ratio, the peak frequency for the driving velocity of the vibratory actuator having higher resonance point can come much higher, and the peak frequency for the driving velocity of the vibratory actuator having lower resonance point can come much lower. Accordingly, an actuation of the vibratory actuator other than selected one can be inhibited.

In the driving device according to the present invention, the vibration generating portion may comprise a piezoelectric element and a driving stem which is connected to one end of the piezoelectric element and frictionally engages with the driven portion, and at least one of the mass of the piezoelectric element, the mass of the driving stem and the spring constant of the piezoelectric element of the at least one vibratory actuator may be different from those of the other vibratory actuator.

In the driving device according to the present invention, the vibration generating portion may comprise a piezoelectric element, a weight which is connected to the one end of the piezoelectric element and a driving stem which is connected to the other end of the piezoelectric element and frictionally engages with the driven portion, and at least one of the mass of the piezoelectric element, the mass of the weight, the mass of the driving stem and the spring constant of the piezoelectric element of the at least one vibratory actuator may be different from those of the other vibratory actuator.

According to the present invention, a plurality of vibratory actuators is connected in parallel and one vibratory actuator to be mainly actuated is selected by a waveform of a driving voltage. Therefore, only one driving circuit is required and only two conductive leads are required to be wired out from the driving circuit.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE PREFERRED EMBODIMENT

Figure 1:
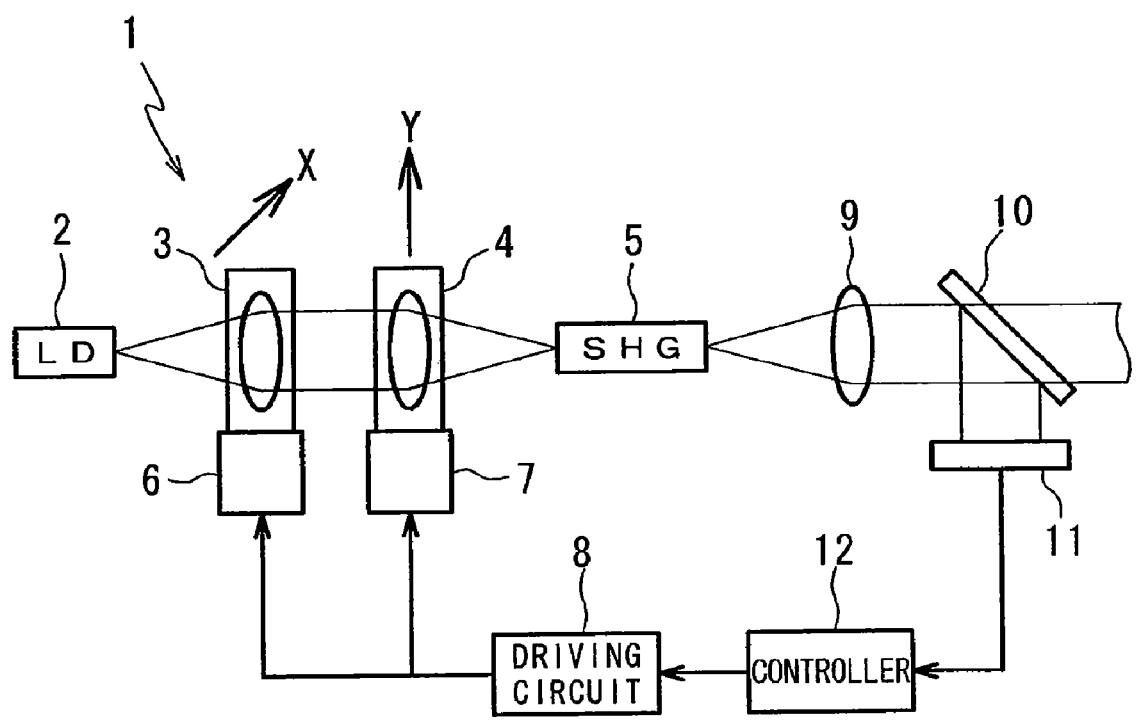
FIG. 1 is a schematic configuration diagram of a laser module including a driving device according to the first embodiment of the present invention.

FIG. 1 shows a laser module 1 including a driving device according to the first embodiment of the present invention. The laser module 1 comprises a laser diode 2 which generates an infrared laser light having a wavelength of 1064 nm, X-axial correction lens 3 which is movable in X direction orthogonal to the infrared laser light, Y axial correction lens 4 which is movable in Y direction orthogonal to the infrared laser light and the X direction, and a second harmonic generator element 5. The X-axial correction lens 3 is positioned by an X-axis actuator 6 in X direction and the Y-axis correction lens 4 is positioned by a Y-axis actuator 7 in Y direction. The X-axis actuator 6 and Y-axis actuator 7 is connected in parallel and driven by a driving voltage input from a driving circuit 8.

The second harmonic generator element 5 generates a green laser light at a half wavelength (532 nm) from the input laser light and out put the green laser light. The green laser light output from the second harmonic generator element 5 is formed into a collimated light beam by a projection lens 9 and split by a beam splitter 10 to input a part of the green laser light to a power monitor 11 consisting of a photodiode and to project remaining most part of the green laser light outside. The power monitor 11 generates a voltage signal according to the intensity of the received green laser light and input the voltage signal to a controller 12 comprising a microcomputer. The controller 12 controls the driving circuit 8 based on the output of the power monitor 10.

The second harmonic generator element 5 has a light receiving portion with a diameter of 1-3 μm. The X-axis correction lens 3 and Y-axis correction lens 4 concentrate the infrared laser light in a diameter compatible to the diameter of the receiving portion of the second harmonic generator element 5, and move the axis of the infrared laser light in X direction and Y direction to align the axis of the infrared laser light with the center of the receiving portion of the second harmonic generator element 5. In the case of the axis of the infrared laser light enters eccentrically into the second harmonic generator element 5, the power of the green light output from the second harmonic generator element 5 comes down. The controller 12 make the driving circuit 8 to generate a driving voltage for driving the X-axis actuator 6 and Y-axis actuator 7 so as to maximize the power of the green laser light, accordingly to align the infrared laser light with the second harmonic generator element 5.

Figure 2:
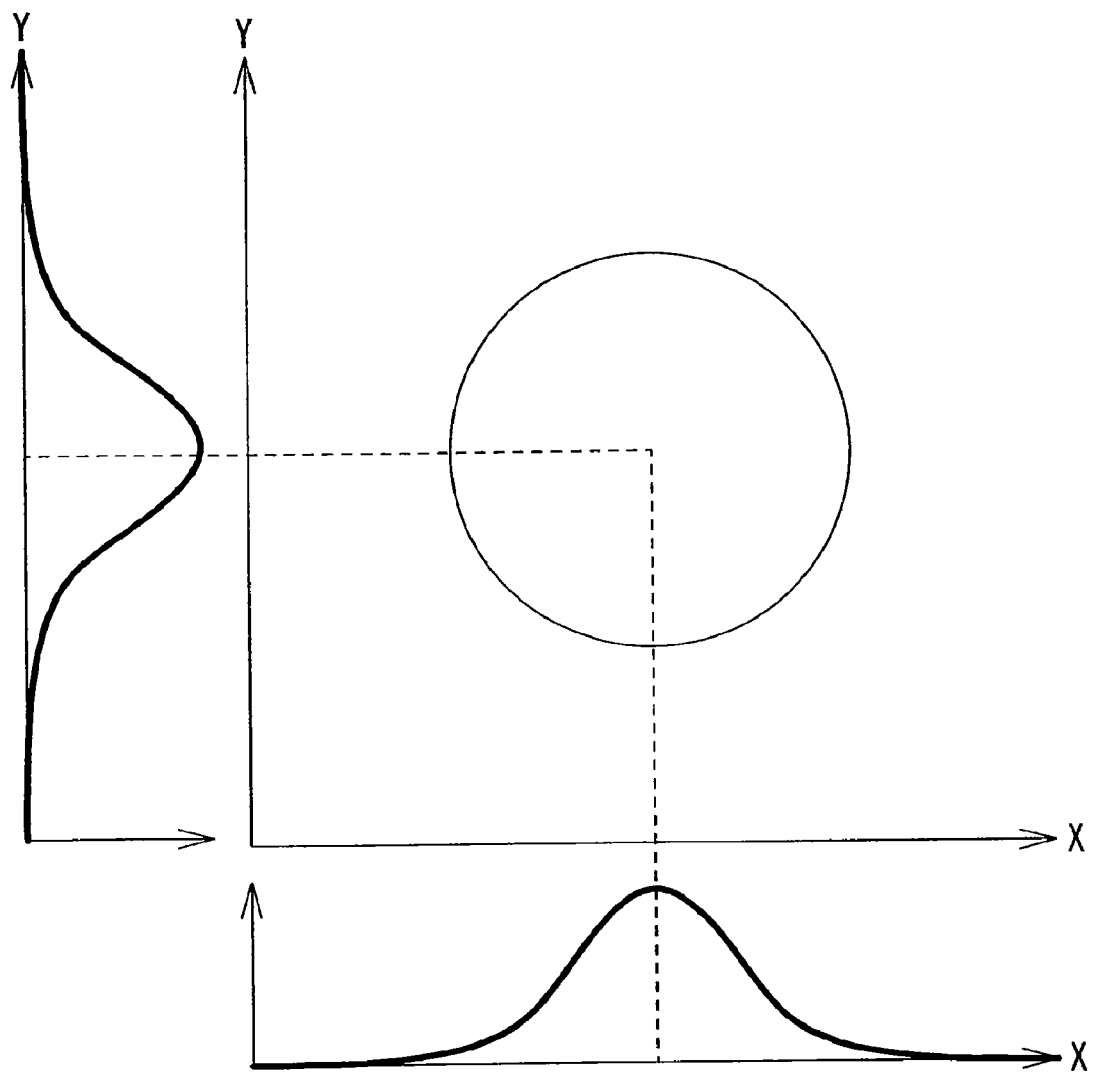
FIG. 2 is a profile of the output of the laser module in the FIG. 1.

FIG. 2 shows the relationship between the position of the infrared laser light in X-Y direction in reference to the second harmonic generator element 5 and the output power of the power monitor 11. As illustrated, the power of the power monitor 11 corresponding to the eccentricity of the infrared laser light with respect to the second harmonic generator element 5 is plotted as a Gaussian profile regardless of the eccentric direction. The controller 12 drives the X-axis actuator 6 and the Y-axis actuator 7 by known means such as a wobbling control and hill climbing control.

Figure 3:
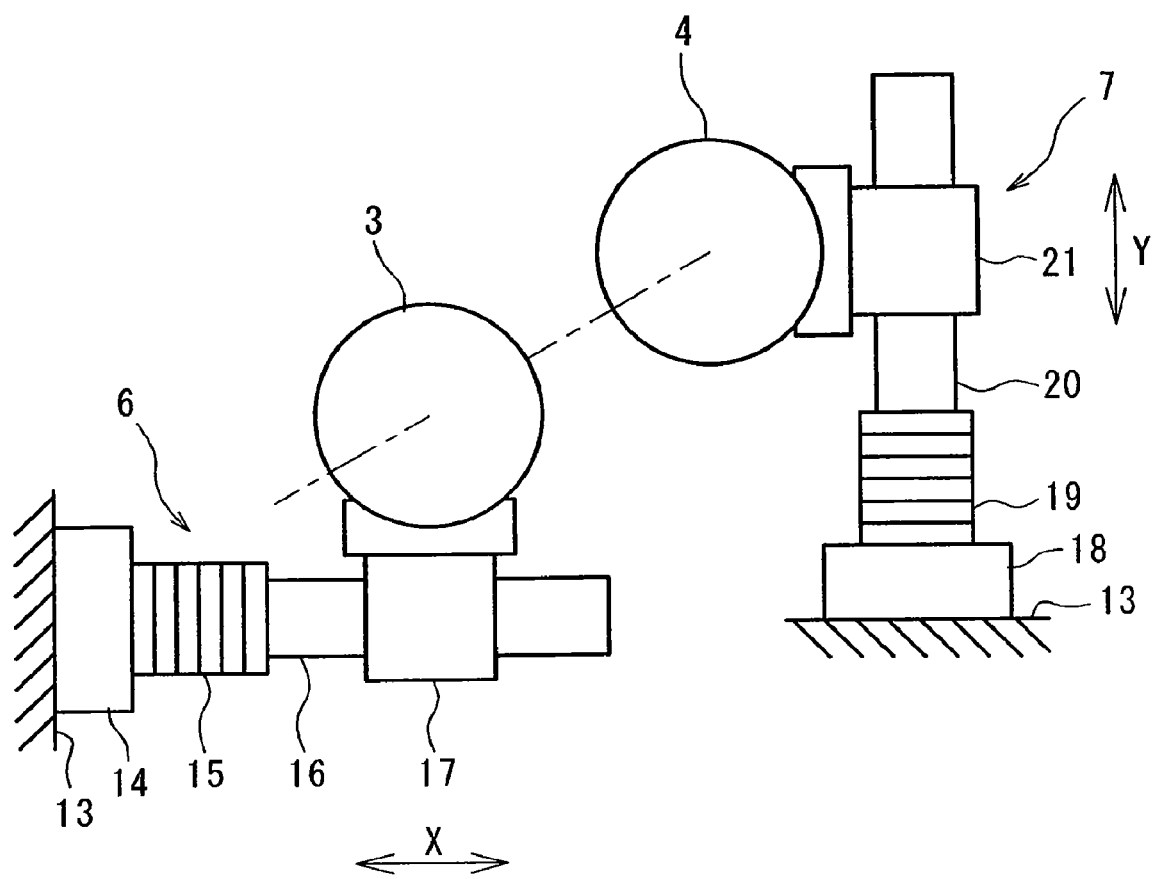
FIG. 3 is a schematic view of the actuators of the driving device in the FIG. 1.

FIG. 3 shows the configuration of the X-axis actuator 6 and the Y-axis actuator 7. The X-axis actuator 6 comprises a weight 14 fixed to the chassis 13 of the laser module 1, a piezoelectric element 15 of which one end is fixed to the weight 14, a driving stem 16 fixed to the other end of the piezoelectric element 15 and a movable member 17 engaging with the driving stem 16. The movable member 17 holds the X-axis correction lens 3. The weight 14, the piezoelectric element 15 and driving stem 16 constitute a vibration generating portion which vibrates the driving stem 16 in X direction with a driving voltage applied to the piezoelectric element 15. The movable member 17 and the X-axis correction lens 3 constitute a driven portion which engages with the vibration generating portion and can be srippingly displaced in the X-axis direction.

Similarly, the Y-axis actuator 7 comprises a weight 18 fixed to the chassis 13 of the laser module 1, a piezoelectric element 19 of which one end is fixed to the weight 18, a driving stem 20 fixed to the other end of the piezoelectric element 19 and a movable member 21 engaging with the driving stem 20. The movable member 21 holds the Y-axis correction lens 4. The weight 18, the piezoelectric element 19 and driving stem 20 constitute a vibration generating portion which vibrates the driving stem 20 in Y direction. The movable member 21 and the Y-axis correction lens 4 constitute a driven portion which engages with the vibration generating portion and can be srippingly displaced in the Y-axis direction. These X-axis actuator 6 and Y-axis actuator 7 are kinds of a vibratory actuator which srippingly displace a driven portion by the vibration of the vibration generating portion.

Figure 4:
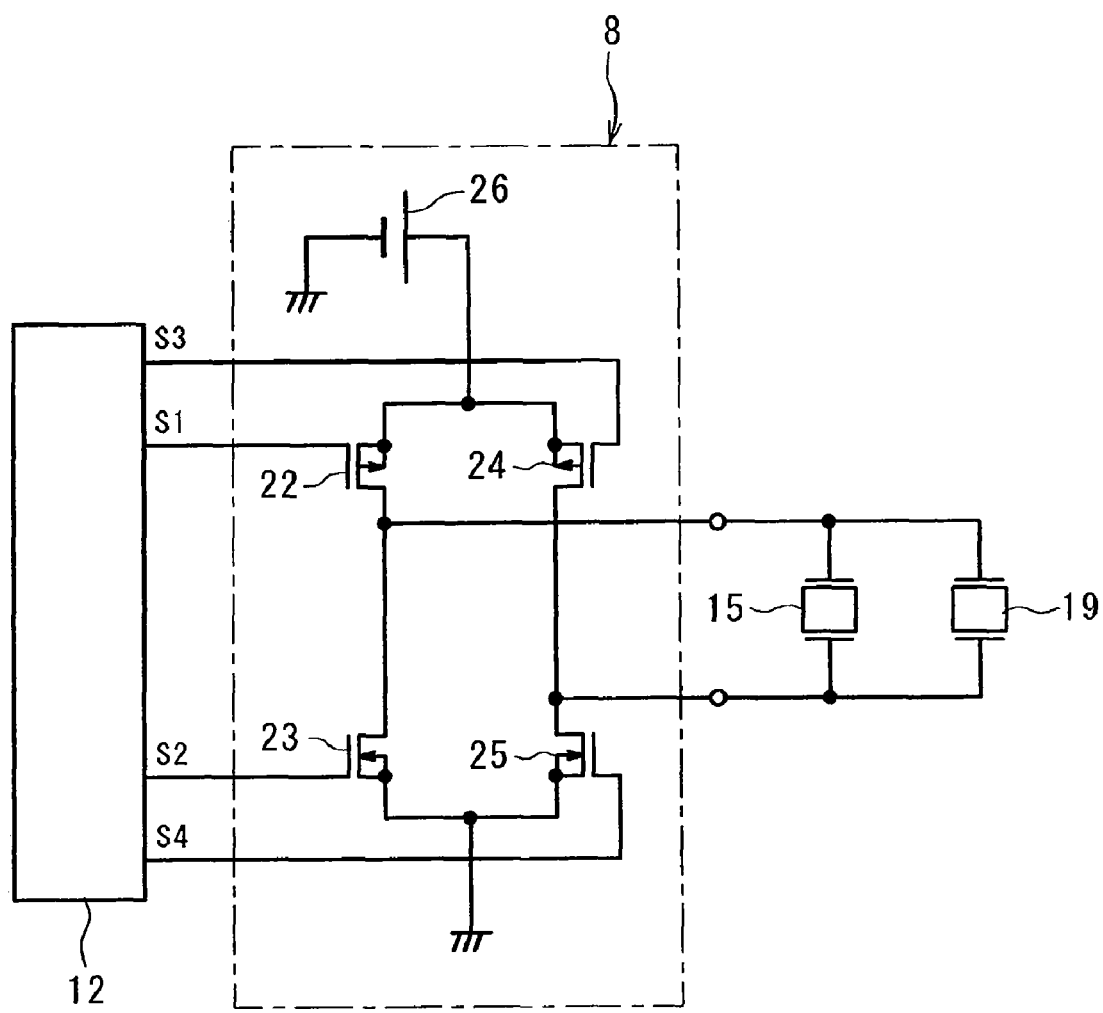
FIG. 4 is a circuit diagram of the driving circuit of the driving device in the FIG. 1.

FIG. 4 shows a circuit configuration of the driving circuit 8. The driving circuit 8 is a full bridge circuit which is provided with four transistors 22, 23, 24, turned ON/OFF by control signals S1, S2, S3, S4 input from the control circuit 12 and a power source 26 and which connects one electrode each of the piezoelectric elements 15 and 19 to the power source 26 and grounds other electrode, by turning ON the transistor 22 and 25 or the transistor 23 and 24. The piezoelectric elements 15, 19 are connected in parallel to the driving circuit and so only one pair (two) of conductive leads are wired out from the driving circuit 8. The conductive leads extended from the driving circuit 8 are practically connected to only one piezoelectric element 15 and another conductive leads are wired for power transit between the electrodes of the piezoelectric elements 15 and 19.

Figure 5:
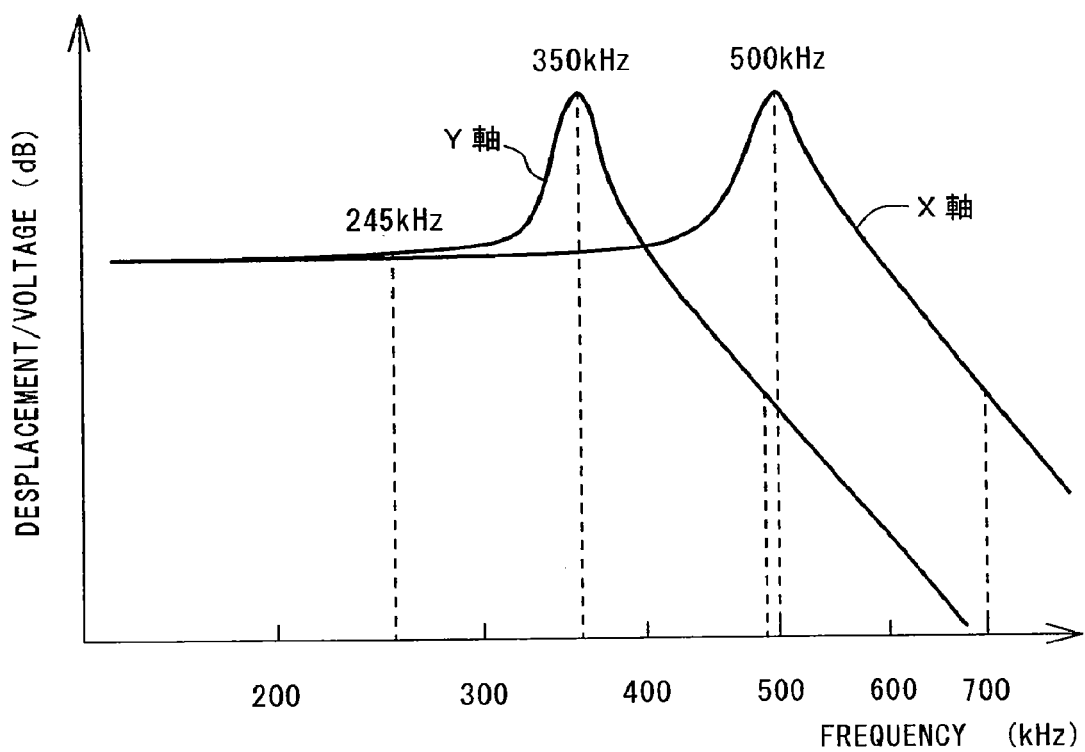
FIG. 5 shows frequency characteristics of the vibration generating portion of the actuators in the FIG. 3.

Further, FIG. 5 shows frequency characteristics of the vibration generating portion of the X-axis actuator 6 and the Y-axis actuator 7, i.e. amount of displacement (amplitude of vibration) of the driving stem 16, 20 corresponding to the driving voltage. The amount of displacement of the driving stem 16 of the X-axis actuator 6 corresponding to the sine wave voltage comes to maximum when the frequency of the sine wave voltage is 500 kHz, and the amount of displacement of the driving stem 20 of the Y-axis actuator 7 comes to maximum when the frequency of the sine wave voltage is 350 kHz.

Figure 6:
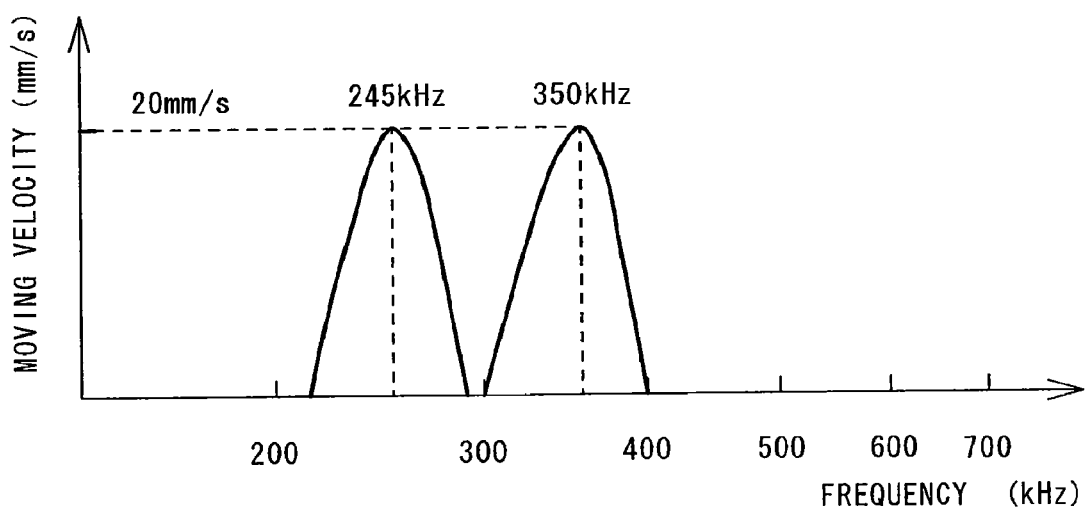
FIG. 6 shows frequency characteristics of the driving velocity of the actuators in the FIG. 3.

FIG. 6 shows moving velocities of the movable member 17, 21 in the case of a rectangular wave voltage with a duty ratio of 30% is input to the X-axis actuator 6 and the Y-axis actuator 7 having above frequency characteristics. The X-axis actuator 6 and the Y-axis actuator 7 get maximum moving velocity of the movable member 17, 21 at 350 kHz and 245 kHz as 0.7 times of the frequency which maximize the amount of displacements of the movable member 17, 21.

Accordingly, when the driving circuit 8 in the laser module 1 outputs a driving voltage having a rectangular waveform with frequency of 350 kHz and duty ratio of 30% or 70%, the X-axis actuator 6 moves the X-axis correction lens 3 efficiently. However, the Y-axis actuator 7 can not drive the movable member 21 with this driving voltage and thus can not move the Y-axis correction lens 4. When the driving circuit 8 outputs a driving voltage having a rectangular waveform with frequency of 245 kHz and duty ratio of 30% or 70%, the X-axis actuator 6 can not move the X-axis correction lens 3, but the Y-axis actuator 7 can move the Y-axis correction lens 4 efficiently. Consequently, either one of the X-axis actuator 6 or the Y-axis actuator 7 can be driven by choosing a frequency of the output cycle of the control signals S1, S2, S3, S4 at the controller 12.

Figure 7:
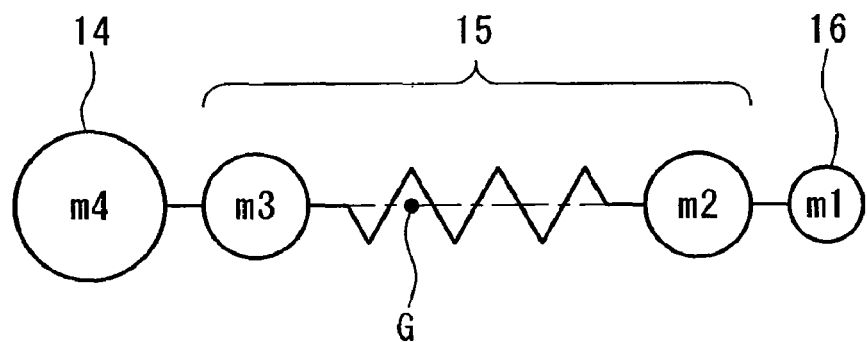
FIG. 7 shows a vibration model of the actuator in the FIG. 3.

FIG. 7 shows a vibration model of the vibration generating portion of the X-axis actuator 6 and the Y-axis actuator 7. The vibration is approximately considered as in which both sides with respect to the center of inertia G of the vibration generating portion (the weight 14, 18, the piezoelectric element 15, 19 and driving stem 16, 20) of the X-axis actuator 6 and the Y-axis actuator 7 expand and contract oppositely. Specifically, the resonant frequency f of the vibration is described as $f=1/(2\pi)\cdot\text{sqrt}(((m1+m2)+(m3+m4))/((m1+m2)\cdot(m3+m4))\cdot K)$, wherein the mass of the driving stems 16, 20 are m1, the mass of the portion on the driving stems 16, 20 sides of the piezoelectric elements 15, 19 with respect to the center of inertia G are m2, the mass of the portion on the weights 14, 18 sides of the piezoelectric elements 15, 19 with respect to the center of inertia G are m3, the mass of the weights 14, 18 are m4 and the spring constants of the piezoelectric elements 15, 19 are K.

The ratio between the mass m2 and the mass m3 corresponds to the ratio between the lengths from the center of inertia G to both ends of the piezoelectric elements 15, 19. Therefore, it can be designed to have desired resonant frequency by differing of at least any of the masses m1 of the driving stems 16, 20, the masses (m2+m3) of the piezoelectric elements 15, 19, the masses m4 of the weights 14, 18 and the spring constants K of the piezoelectric elements 15, 19 between the X-axis actuator 6 and the Y-axis actuator 7 so as to make the frequency characteristics of the vibration generating portion of the X-axis actuator 6 and the Y-axis actuator 7 to have different resonant frequency as shown in the FIG. 5.

Specifically, by making the mass m1 of the driving stem 16 or the mass m4 of the weight 14 of the X-axis actuator 6 smaller compared to those of the Y-axis actuator 7, the resonance frequency of the vibration generating portion of the X-axis actuator 6 comes to higher than the resonance frequency of the Y-axis actuator 7. Also, by making the piezoelectric element 15 of the X-axis actuator 6 shorter compared to the piezoelectric element 19 of the Y-axis actuator 7, the mass (m2+m3) comes to smaller and the spring constant K comes to larger, consequently the resonance frequency of the vibration generating portion of the X-axis actuator 6 comes to lower than the resonance frequency of the Y-axis actuator 7.

As described above, according to the present invention, either the X-axis actuator 6 or the Y-axis actuator 7 can be driven, by choosing the frequency (waveform) of the driving voltage output by the driving circuit, with the X-axis actuator 6 and the Y-axis actuator 7 having the vibration generating portion with different resonance frequency and connected in parallel. Therefore, the driving circuit is simplified and only one pair (two wires) of conductive leads is required. Thus, the driving device can be easily assembled. Furthermore, since the control device comprises a microcomputer, the output cycle of the control signal S1, S2, S3, S4 can be varied by merely an alteration of the program.

Figure 8:
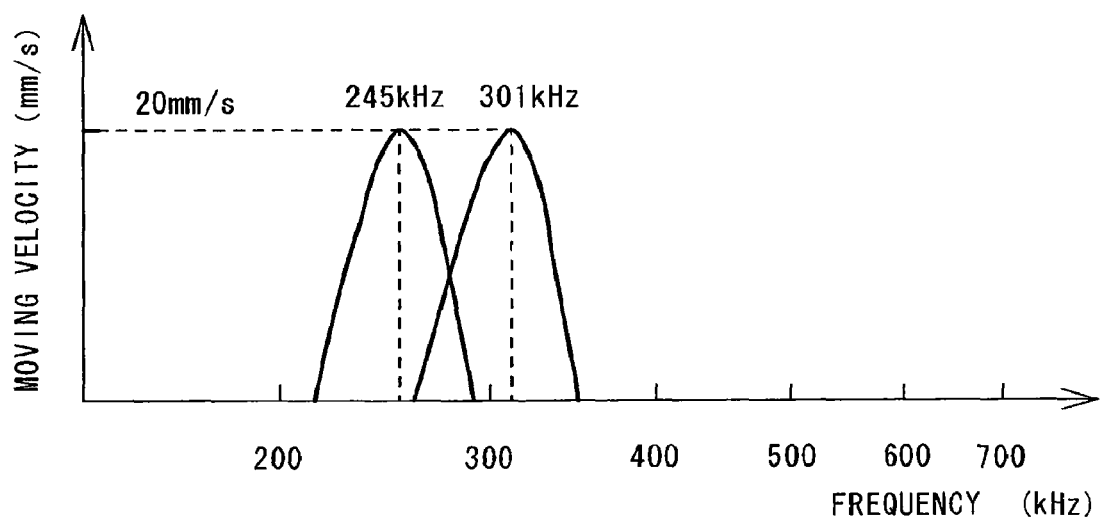
FIG. 8 shows frequency characteristics of the driving velocity different from the actuators in the FIG. 3.

FIG. 8 shows moving velocities of the movable member 17, 21, in the case where their difference is smaller, with applying the rectangular waveform driving voltage having the duty ratio of 30% to the X-axis actuator 6 and the Y-axis actuator 7. In this example, the moving velocity of the movable member 17 in the X-axis actuator 6 (which resonance frequency of the vibration generating portion is 430 kHz) comes to maximum when the frequency of the driving voltage is 301 kHz, and the moving velocity of the movable member 21 in the Y-axis actuator 7 (which resonance frequency of the vibration generating portion is 350 kHz) comes to maximum when the frequency of the driving voltage is 245 kHz.

In this case, when the driving voltage having the frequency of 301 kHz is applied to drive the X-axis actuator 6, the Y-axis actuator 7 can be actuated slightly. But, if the X-axis actuator 6 and the Y-axis actuator 7 is driven alternately, so the infrared laser light is aligned alternately in the X direction and the Y direction, then the unintended actuation of the Y-axis actuator 7 while the actuation of the X-axis actuator 6 and the unintended actuation of the X-axis actuator 6 while the actuation of the Y-axis actuator 7 are very small and thus do not substantially influence the power of the green laser light output from the second harmonic generator element 5.

Figure 9:
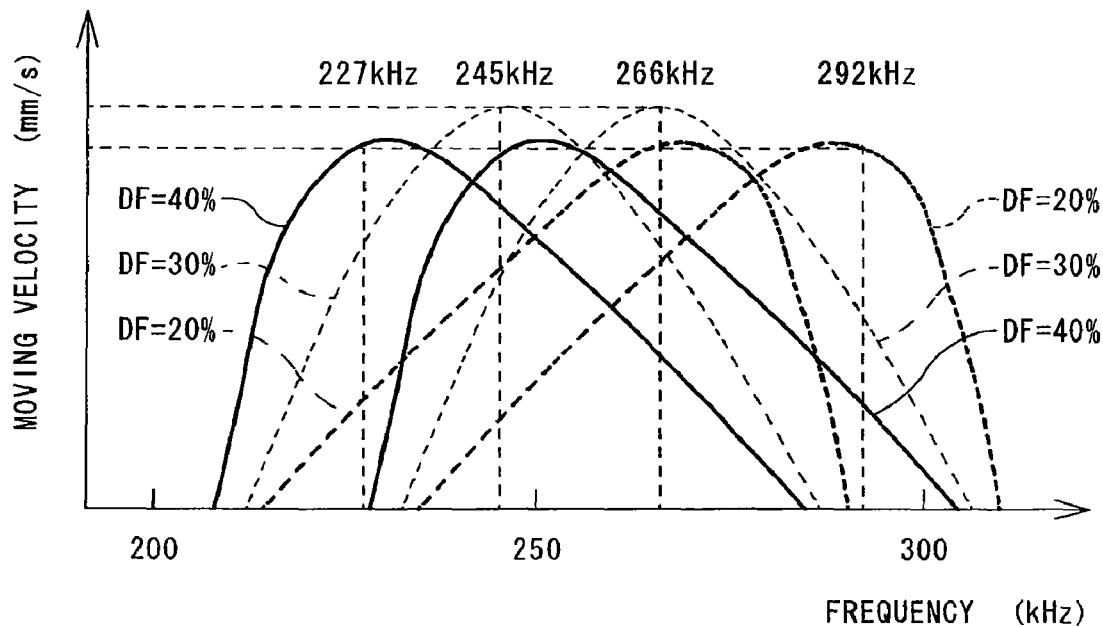
FIG. 9 shows other frequency characteristics of the driving velocity different from the actuators in the FIG. 3.

Further, FIG. 9 shows moving velocities in the case the where a frequency making the moving velocity of the movable member 17 of the X-axis actuator 6 (which resonance frequency of the vibration generating portion is 390 kHz) maximum is 266 kHz, and a frequency making the moving velocity of the movable member 21 of the Y-axis actuator 7 (which resonance frequency of the vibration generating portion is 350 kHz) maximum is 245 kHz. In this example, when the driving circuit outputs a driving voltage with 30% of duty ratio and 266 kHz of frequency which maximize the driving velocity of the X-axis actuator 6, the driving velocity of the Y-axis actuator 7 is considerable amount.

For this case, by varying also the duty ratio of the driving voltage not only the frequency of the driving voltage, the frequency characteristics of the moving velocity of the movable member 17, 21 can be modified. Generally, the peak value of the profile of the moving velocity of the movable member 17, 21 is maximized in the case of the driving voltage has a duty ratio around 30% or 70%. By shifting the duty ratio from the optimum value (30% or 70%) purposely, as shown in the FIG. 9, while the peak value comes relatively smaller, the frequency which shows the peak value of the moving velocities of the movable member 17, 21 can be shifted. Specifically, the peak frequency comes up with bigger difference between the ON duration and OFF duration of the driving voltage, and the peak frequency comes down with smaller difference between the ON duration and OFF duration of the driving voltage. Such changes of the frequency property due to the duty ratio do not sift significantly the range of the frequency capable of moving the movable member 17, 21, but distort the profile in saw toothed shape.

Therefore, when the X-axis actuator 6 having higher resonance point of the vibration generating portion is driven at 20% of the duty ratio and at 292 kHz as the peak frequency with this duty ratio, the driving velocity of the Y-axis actuator 7 can be neglected practically. Conversely, when the Y-axis actuator 7 having lower resonance point of the vibration generating portion is driven at 40% of the duty ratio and at 227 kHz as the peak frequency with this duty ratio, the driving velocity of the X-axis actuator 6 can be neglected practically.

Figure 10:
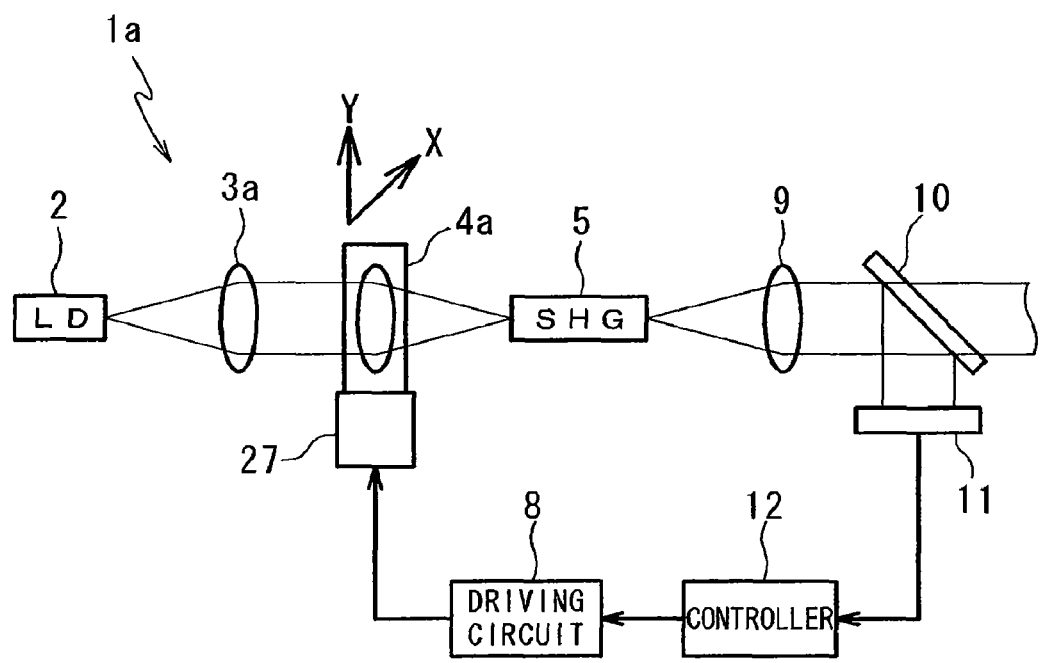
FIG. 10 is a schematic configuration diagram of a laser module including a driving device according to the second embodiment of the present invention.

FIG. 10 shows the laser module 1a according to the second embodiment of the present invention. In the illustration with respect to this embodiment, components corresponding to those in the first embodiment are designed by same reference numerals, then any redundant description is omitted. The laser module 1a has an immobile fixed lens 3a and correction lens 4a movable in X-Y directions wherein the correction lens 4a is positioned by a positioning device 27 which incorporates two actuators so as to position X-Y directions.

Figure 11:
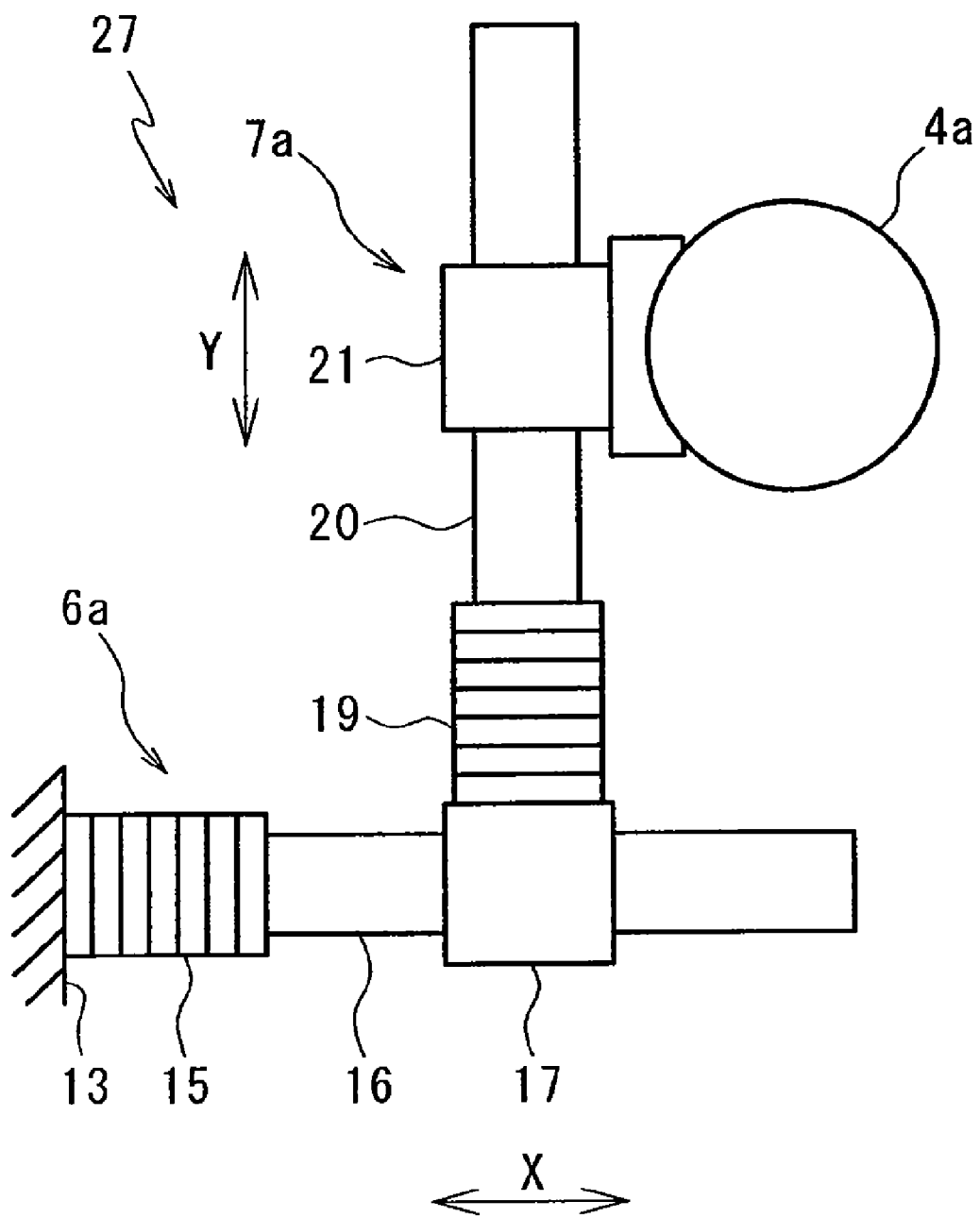
FIG. 11 is a schematic view of the actuators of the driving device in the FIG. 10.

As shown in FIG. 11, the positioning device 27 has an X-axis actuator 6a of which movable member 17 holds an Y-axis actuator 7a positioning the correction lens 4a in Y direction. The X-axis actuator 6a and the Y-axis actuator 7a of this embodiment dose not have the weight. Even in this configuration, either one of the X-axis actuator 6a or the Y-axis actuator 7a can be selectively driven by choosing a frequency (and a duty ratio) of the driving voltage similarly to the first embodiment.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A driving device comprising:
a plurality of vibratory actuators, wherein each of the plurality of vibratory actuators comprises a vibration generating portion which transform an electric power into a vibration and a driven portion which engages with the vibration generating portion; and
a driving circuit to which the plurality of vibratory actuators are connected in parallel, wherein the vibration generating portion of at least one of the plurality of vibratory actuators has a different frequency characteristic from that of the vibration generating portion of another of the plurality of vibratory actuators, and the driving circuit is capable of outputting a plurality of driving voltages each having a different waveform.

2. A driving device as claimed in the claim 1, wherein the plurality of driving voltages respectively are rectangular waves and have different frequencies.

3. A driving device as claimed in the claim 2, wherein the plurality of driving voltages further have different duty ratios respectively.

4. A driving device as claimed in the claim 3, wherein one of the different duty ratios comes to have a bigger difference than that at 70% of duty ratio between ON duration and OFF duration in the case of the frequency of the driving voltage is high, and the one of the duty ratios comes to have a bigger difference than that at 70% of duty ratio between ON duration and OFF duration in the case of the frequency of the driving voltage is low.

5. A driving device as claimed in the claim 1, wherein the vibration generating portion of one of the plurality of vibratory actuators comprises a piezoelectric element and a driving stem which is connected to one end of the piezoelectric element and frictionally engages with the driven portion.

6. A driving device as claimed in the claim 5, wherein at least one of a mass of the piezoelectric element, a mass of the driving stem and a spring constant of the piezoelectric element is different from those of another one of the plurality of vibratory actuators.

7. A driving device as claimed in the claim 1, wherein the vibration generating portion of one of the plurality of vibratory actuators comprises a piezoelectric element, a weight which is connected to one end of the piezoelectric element and a driving stem which is connected to another end of the piezoelectric element and frictionally engages with the driven portion.

8. A driving device as claimed in the claim 7, wherein at least one of a mass of the piezoelectric element, a mass of the weight, a mass of the driving stem and a spring constant of the piezoelectric element may be different from those of another one of the plurality of vibratory actuators.

9. A driving device as claimed in the claim 1, wherein each of the plurality of vibratory actuators comprises two vibratory actuators arranged orthogonal to each other.

* * * * *